(12) United States Patent
Morioka et al.

(10) Patent No.: US 11,662,390 B2
(45) Date of Patent: May 30, 2023

(54) VOLTAGE DETECTION UNIT

(71) Applicants: YAZAKI CORPORATION, Tokyo (JP); TOYOTA JIDOSHA KABUSHIKI KAISHA, Toyota (JP); KABUSHIKI KAISHA TOYOTA JIDOSHOKKI, Kariya (JP)

(72) Inventors: Satoshi Morioka, Okazaki (JP); Motoyoshi Okumura, Nagoya (JP); Hiromi Ueda, Kariya (JP); Naoto Morisaku, Kariya (JP); Yutaro Okazaki, Kakegawa (JP); Shinichi Yanagihara, Kakegawa (JP)

(73) Assignees: YAZAKI CORPORATION, Tokyo (JP); TOYOTA JIDOSHA KABUSHIKI KAISHA, Toyota (JP); KABUSHIKI KAISHA TOYOTA JIDOSHOKKI, Kariya (JP)

( * ) Notice: Subject to any disclaimer, the term of this patent is extended or adjusted under 35 U.S.C. 154(b) by 0 days.

(21) Appl. No.: 17/731,711

(22) Filed: Apr. 28, 2022

(65) Prior Publication Data
US 2022/0349946 A1    Nov. 3, 2022

(30) Foreign Application Priority Data

Apr. 30, 2021   (JP) .............................. JP2021-078142

(51) Int. Cl.
*G01R 31/3835* (2019.01)
*G01R 19/00* (2006.01)
(Continued)

(52) U.S. Cl.
CPC ...... *G01R 31/3835* (2019.01); *H01M 50/298* (2021.01); *G01R 1/04* (2013.01);
(Continued)

(58) Field of Classification Search
CPC .... G01R 31/00; G01R 31/36; G01R 31/3644; G01R 31/382; G01R 31/3835; G01R 1/00;
(Continued)

(56) References Cited

U.S. PATENT DOCUMENTS

2022/0349922 A1* 11/2022 Okazaki ............. G01R 19/0084
2022/0349923 A1* 11/2022 Morioka ................. G01R 1/04
2022/0349945 A1* 11/2022 Morioka ............. H01M 10/482

FOREIGN PATENT DOCUMENTS

| CN | 102868126 B | * | 4/2016 | .......... B60L 11/1879 |
| CN | 112928323 A | * | 6/2021 | .............. B60L 58/30 |

(Continued)

*Primary Examiner* — Hoai-An D. Nguyen
(74) *Attorney, Agent, or Firm* — Sughrue Mion, PLLC

(57) ABSTRACT

A voltage detection unit includes a voltage detection terminal configured to be conductively connected to a detection target, an electric wire conductively connected to the voltage detection terminal and a housing having a plate shape and including a terminal accommodating concave configured to accommodate the voltage detection terminal, an electric wire accommodating concave defined by a first groove side wall, a second groove side wall and a groove bottom surface, and configured to accommodate the electric wire and to guide the electric wire out of the housing and an electric wire restricting portion configured to hold the electric wire between the electric wire restricting portion and the groove bottom surface and to prevent the electric wire from being displaced out of the electric wire accommodating concave.

3 Claims, 12 Drawing Sheets

(51) Int. Cl.
  *H01M 10/42*   (2006.01)
  *H01M 10/48*   (2006.01)
  *H01M 50/298*  (2021.01)
  *G01R 1/04*    (2006.01)

(52) U.S. Cl.
  CPC ....... *G01R 19/0084* (2013.01); *H01M 10/425* (2013.01); *H01M 10/482* (2013.01); *Y02E 60/10* (2013.01)

(58) Field of Classification Search
  CPC . G01R 1/02; G01R 1/04; G01R 15/00; G01R 15/12; G01R 15/14; G01R 15/144; G01R 19/00; G01R 19/0084; G01R 19/0092; H01M 10/00; H01M 10/42; H01M 10/425; H01M 10/48; H01M 10/482; H01M 50/00; H01M 50/20; H01M 50/298; Y02E 60/00; Y02E 60/10
  USPC .... 324/76.11, 126, 600, 649, 691, 713, 522; 702/1, 57, 64
  See application file for complete search history.

(56) References Cited

FOREIGN PATENT DOCUMENTS

| | | | | |
|---|---|---|---|---|
| CN | 213398702 U | * | 6/2021 | ......... G01R 31/3835 |
| CN | 111521852 B | * | 8/2022 | ............ G01R 11/24 |
| JP | 5988945 B2 | * | 9/2016 | ............... G01R 1/04 |
| JP | 2020-161340 A | | 10/2020 | |

* cited by examiner

VOLTAGE DETECTION UNIT

CROSS-REFERENCE TO RELATED APPLICATION

The present application claims priority to Japanese Patent Application No. 2021-078142 filed on Apr. 30, 2021, the entire content of which is incorporated herein by reference.

TECHNICAL FIELD

The presently disclosed subject matter relates to a voltage detection unit configured such that a voltage detection terminal to be conductively connected to a detection target is accommodated in a plate shaped housing.

BACKGROUND

In related art, there has been proposed a stacked power storage device in which a plurality of power storage modules are connected in series via conductive plates by alternately arranging and repeatedly stacking the thin plate-shaped power storage modules each capable of charging and discharging and the conductive plates. The power storage module used in this type of power storage device generally has a structure in which a plurality of battery cells are built therein, and functions as one battery that is capable of charging and discharging. In one of the power storage devices in the related art, in order to monitor an output state of each power storage module (that is, a potential of an output surface of each power storage module with respect to a reference zero potential, hereinafter, also simply referred to as a "voltage of the power storage module"), a detection terminal such as a bus bar is connected to a conductive plate in contact with the output surface of each power storage module, and a voltage of each power storage module is measured via the detection terminal (for example, see JP2020-161340A).

When the bus bar or the like is actually connected to the conductive plate in the power storage device having the above-described structure, it is difficult to secure a space for providing other components for connection (for example, bolts for bolt fastening) since the power storage module or the conductive plate has the thin plate shape. Therefore, in the power storage device described above in the related art, an insertion hole through which the detection terminal is inserted is provided in a side edge portion of the conductive plate, and the detection terminal is inserted into the insertion hole of each conductive plate from a side of a stacked body in which the power storage module and the conductive plate are stacked, thereby connecting the conductive plate and the detection terminal. However, in the connection method in the related art, when the detection terminal is inserted, since position alignment between the insertion hole of the conductive plate and the detection terminal is complicated, it is difficult to improve workability of the connection operation.

Illustrative aspects of the presently disclosed subject matter provide a voltage detection unit excellent in workability of conductive connection with a detection target.

SUMMARY

According to an illustrative aspect of the presently disclosed subject matter, a voltage detection unit includes a voltage detection terminal configured to be conductively connected to a detection target, an electric wire conductively connected to the voltage detection terminal and a housing having a plate shape and including a terminal accommodating concave configured to accommodate the voltage detection terminal, an electric wire accommodating concave defined by a first groove side wall, a second groove side wall and a groove bottom surface, and configured to accommodate the electric wire and to guide the electric wire out of the housing and an electric wire restricting portion configured to hold the electric wire between the electric wire restricting portion and the groove bottom surface and to prevent the electric wire from being displaced out of the electric wire accommodating concave.

Other aspects and advantages of the presently disclosed subject matter will be apparent from the following description, the drawings and the claims.

DESCRIPTION OF EMBODIMENTS

Figure 1:
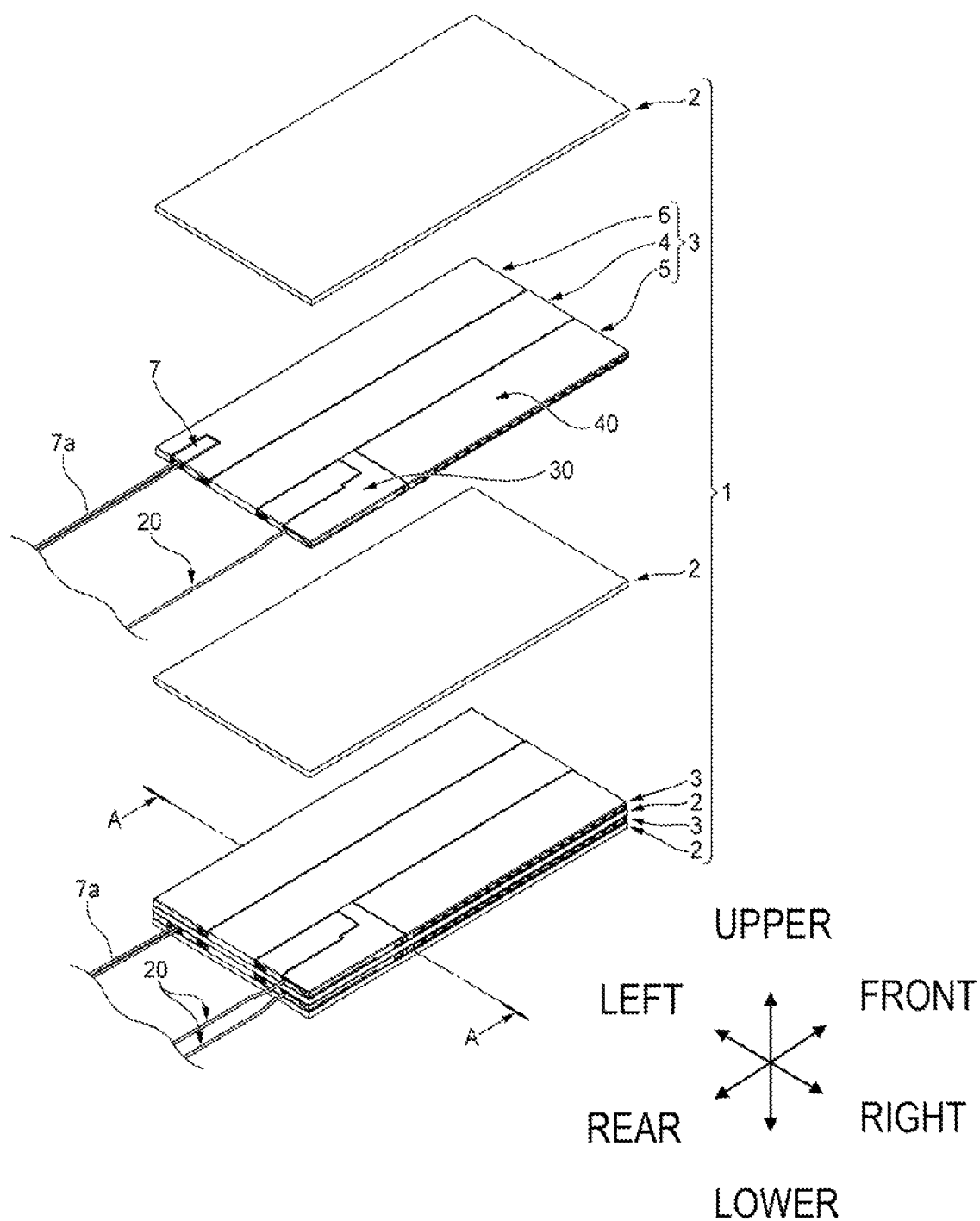
FIG. 1 is a partially exploded perspective view of a stacked power storage device including a voltage detection unit according to an embodiment of the presently disclosed subject matter.

Hereinafter, a voltage detection unit 5 according to an embodiment of the presently disclosed subject matter will be described with reference to the drawings. Hereinafter, for convenience of description, a "front-rear direction", a "left-right direction", an "upper-lower direction", "front", "rear", "left", "right", "upper", and "lower" are defined as shown in FIG. 1 and the like. The "front-rear direction", the "left-right direction", and the "upper-lower direction" are perpendicular to one another. The left-right direction coincides with a first direction in which a cover is attached to a housing and the front-rear direction coincides with a second direction.

A voltage detection unit 5 is typically used in a stacked power storage device 1, such as the one shown in FIG. 1.

The power storage device 1 is formed by alternately stacking, in the upper-lower direction, rectangular thin plate-shaped power storage modules 2 that are capable of charging and discharging, and rectangular thin plate-shaped conductive modules 3 that can electrically connect adjacent power storage modules 2 to each other. In the power storage device 1, a plurality of power storage modules 2 are electrically connected to each other in series via the conductive modules 3. The power storage module 2 has a structure in which a plurality of battery cells (not shown) are built in, and the power storage module 2 as a whole functions as one battery that is capable of charging and discharging.

Figure 2A:
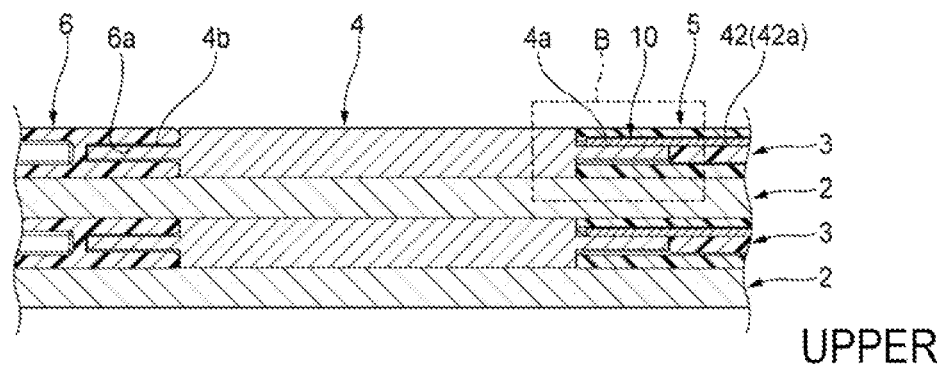
FIG. 2A is a cross-sectional view taken along a line A-A of FIG. 1.

As shown in FIG. 1, the conductive module 3 includes a conductive plate 4 having a rectangular thin plate shape (the conductive plate 4 also has a function as a heat sink as described later), a voltage detection unit 5 having a rectangular thin plate shape connected to a right side of the conductive plate 4, and a opposite unit 6 having a rectangular thin plate shape connected to a left side of the conductive plate 4, and is formed to have a rectangular thin plate shape as a whole. As shown in FIGS. 1 to 3 (particularly, see FIG. 2A), the conductive plate 4 and the voltage detection unit 5 are connected to each other by fitting a flange portion 4a provided on a right end surface of the conductive plate 4 and extending in the front-rear direction into a concave portion 5a provided on a left end surface of the voltage detection unit 5 and extending in the front-rear direction. The conductive plate 4 and the opposite unit 6 are connected to each other by fitting a flange portion 4b provided on a left end surface of the conductive plate 4 and extending in the front-rear direction into a concave portion 6a provided on a right end surface of the opposite unit 6 and extending in the front-rear direction.

In each of the conductive modules 3 located between the adjacent power storage modules 2 in the upper-lower direction, the conductive plate 4 is in direct contact with the upper and lower power storage modules 2 as shown in FIG. 2A. Therefore, the conductive plate 4 has a function of electrically connecting a lower surface of the upper power storage module 2 and an upper surface of the lower power storage module 2 to each other, and a function, as a heat sink, of releasing heat generated from the upper and lower power storage modules 2 to the outside.

In each of the conductive modules 3 located between the adjacent power storage modules 2 in the upper-lower direction, the voltage detection unit 5 includes a voltage detection terminal 10 (see FIGS. 2A and 2B and the like), which will be described later, to be in contact with the conductive plate 4. The voltage detection unit 5 has a function of outputting a signal indicating a voltage between the upper and lower power storage modules 2 (specifically, a potential of the upper surface (output surface) of the lower power storage module 2 with respect to a reference zero potential) via an electric wire 20 (see FIG. 1 and the like) connected to the voltage detection terminal 10. Although the voltage detection unit 5 is disposed on a right side of the conductive plate 4 in FIGS. 1 to 3, a voltage detection unit having the same function as the voltage detection unit 5 may be disposed on a left side of the conductive plate 4. In this case, as the voltage detection unit having the same function as the voltage detection unit 5, a voltage detection unit (that is, a symmetric product of the voltage detection unit 5) obtained by reversing the entire configuration of the voltage detection unit 5 in the left-right direction is used.

In each of the conductive modules 3 located between the adjacent power storage modules 2 in the upper-lower direction, as the opposite unit 6, any one of a voltage detection unit, a dummy unit, or a temperature detection unit is used in accordance with the specification of the power storage device 1.

When the opposite unit 6 is a voltage detection unit, the voltage detection unit (that is, the symmetric product of the voltage detection unit 5 described above) obtained by reversing the entire structure of the voltage detection unit 5 in the left-right direction is used as the opposite unit 6. In this case, the voltage detection unit 5 is disposed on the right side of the conductive plate 4, and the symmetric product of the voltage detection unit 5 is disposed on the left side of the conductive plate 4. The opposite unit 6 (the symmetric product of the voltage detection unit 5) has the same function as the voltage detection unit 5.

When the opposite unit 6 is a dummy unit, as shown in FIG. 3, a simple resin plate having the concave portion 6a extending in the front-rear direction is used as the opposite unit 6. In this case, the opposite unit 6 only has a function of filling a gap between the upper and lower power storage modules 2.

When the opposite unit 6 is a temperature detection unit, as shown in FIG. 1, the opposite unit 6 has a structure in which a temperature sensor 7 (thermistor) is incorporated in the resin plate used as the dummy unit. In this case, the opposite unit 6 has a function of outputting a signal indicating temperatures of the upper and lower power storage modules 2 via an electric wire 7a (see FIG. 1) connected to the temperature sensor 7.

Figure 4:
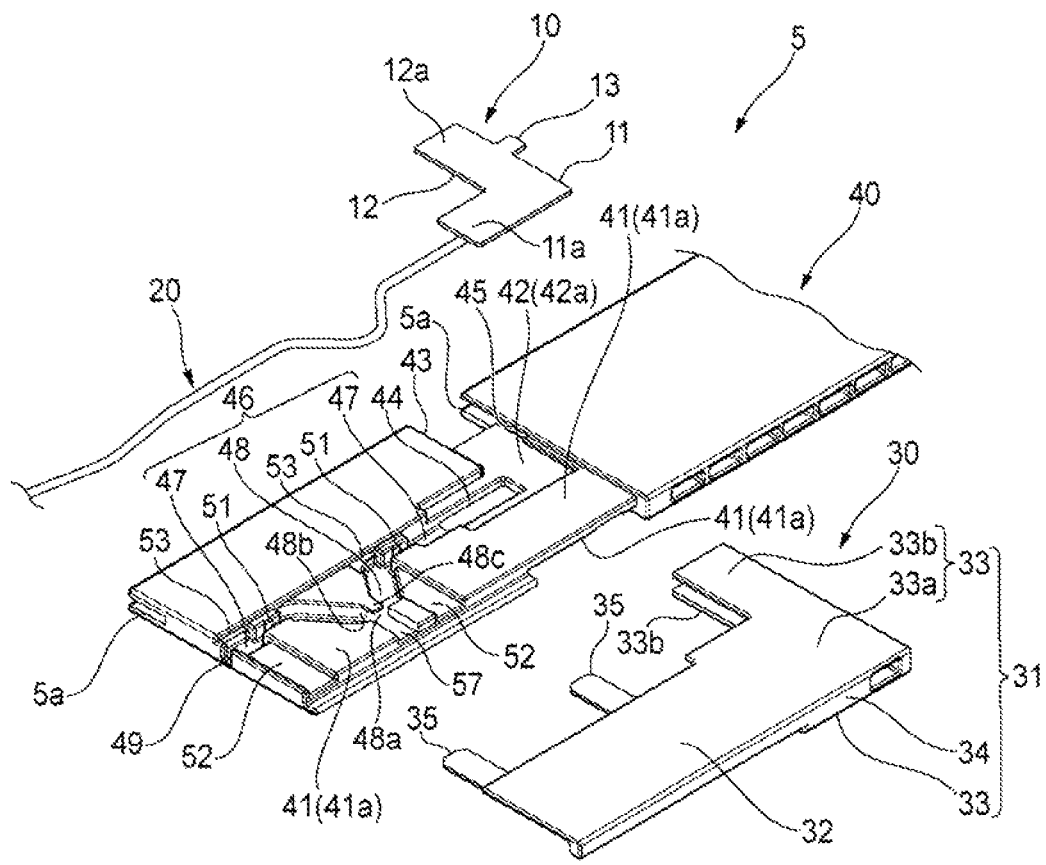
FIG. 4 is an exploded perspective view of the voltage detection unit according to the embodiment of the presently disclosed subject matter shown in FIG. 1.
Figure 5:
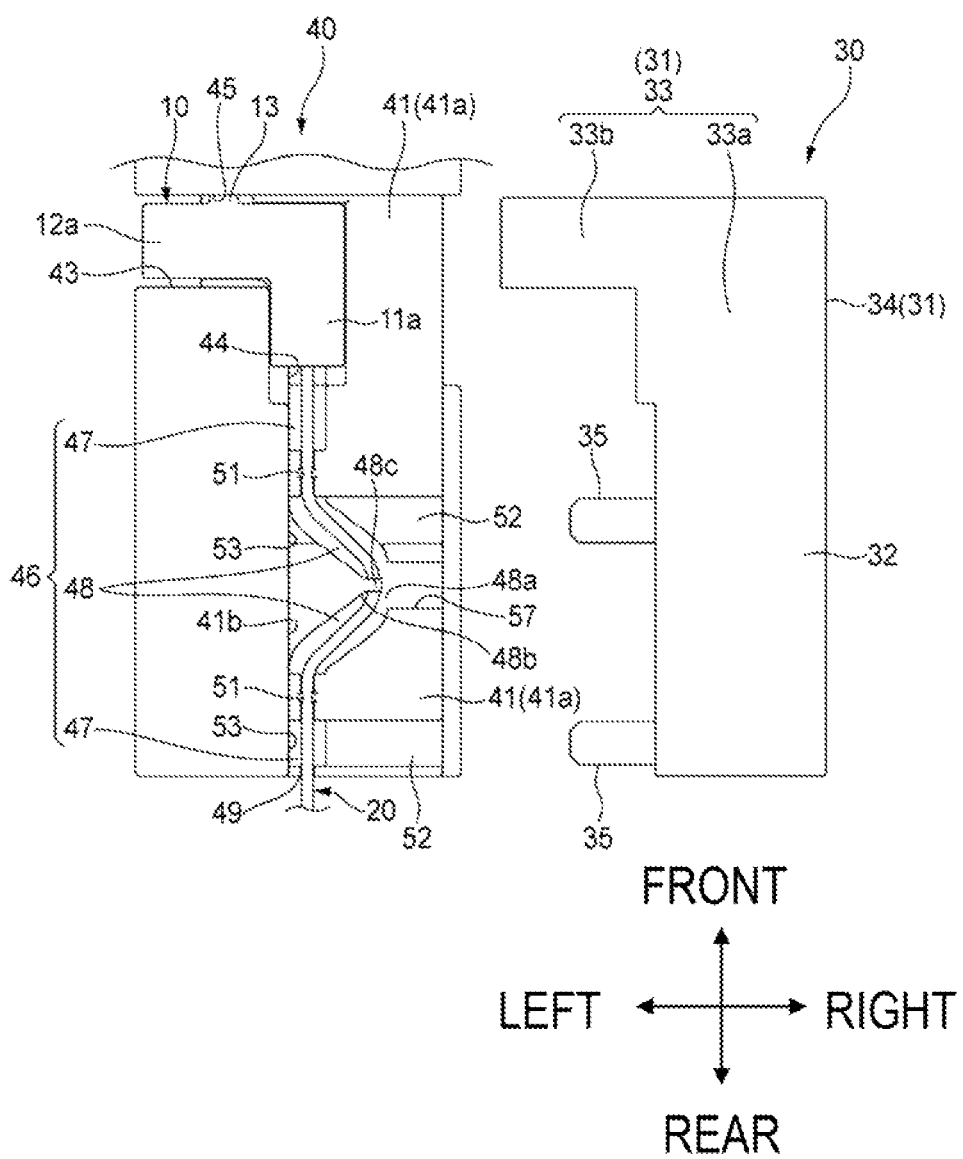
FIG. 5 is a top view showing a housing in which a voltage detection terminal and an electric wire are accommodated and a cover.

Hereinafter, a specific configuration of the voltage detection unit 5 according to the embodiment of the presently disclosed subject matter will be described with reference to FIGS. 4 to 8D. As shown in FIG. 4, the voltage detection unit 5 includes a housing 40, the voltage detection terminal 10 accommodated in the housing 40, the electric wire 20 connected to the voltage detection terminal 10 and accommodated in the housing 40, and a cover 30 attached to the housing 40.

The voltage detection terminal 10 is accommodated in a terminal accommodating concave 42 (see FIG. 4), which will be described later, formed in the housing 40, the electric wire 20 is accommodated in an electric wire accommodating concave 46 (see FIG. 4), which will be described later, formed in the housing 40, and the cover 30 is attached to cover attaching concaves 41 (see FIG. 4), which will be described later, formed in the housing 40. Hereinafter, each member forming the voltage detection unit 5 will be described in order.

First, the voltage detection terminal 10 will be described. The voltage detection terminal 10 made of metal is formed by performing processing such as press processing on one metal plate. The voltage detection terminal 10 is accommodated in the terminal accommodating concave 42 of the housing 40 from above. As shown in FIG. 4, the voltage detection terminal 10 includes a first portion 11 having a rectangular flat plate shape extending in the front-rear direction and a second portion 12 having a rectangular flat plate shape extending leftward from a front end portion of the first portion 11, and has a flat plate shape which is a substantially L-shape as a whole when viewed in the upper-lower direction.

Figure 6:
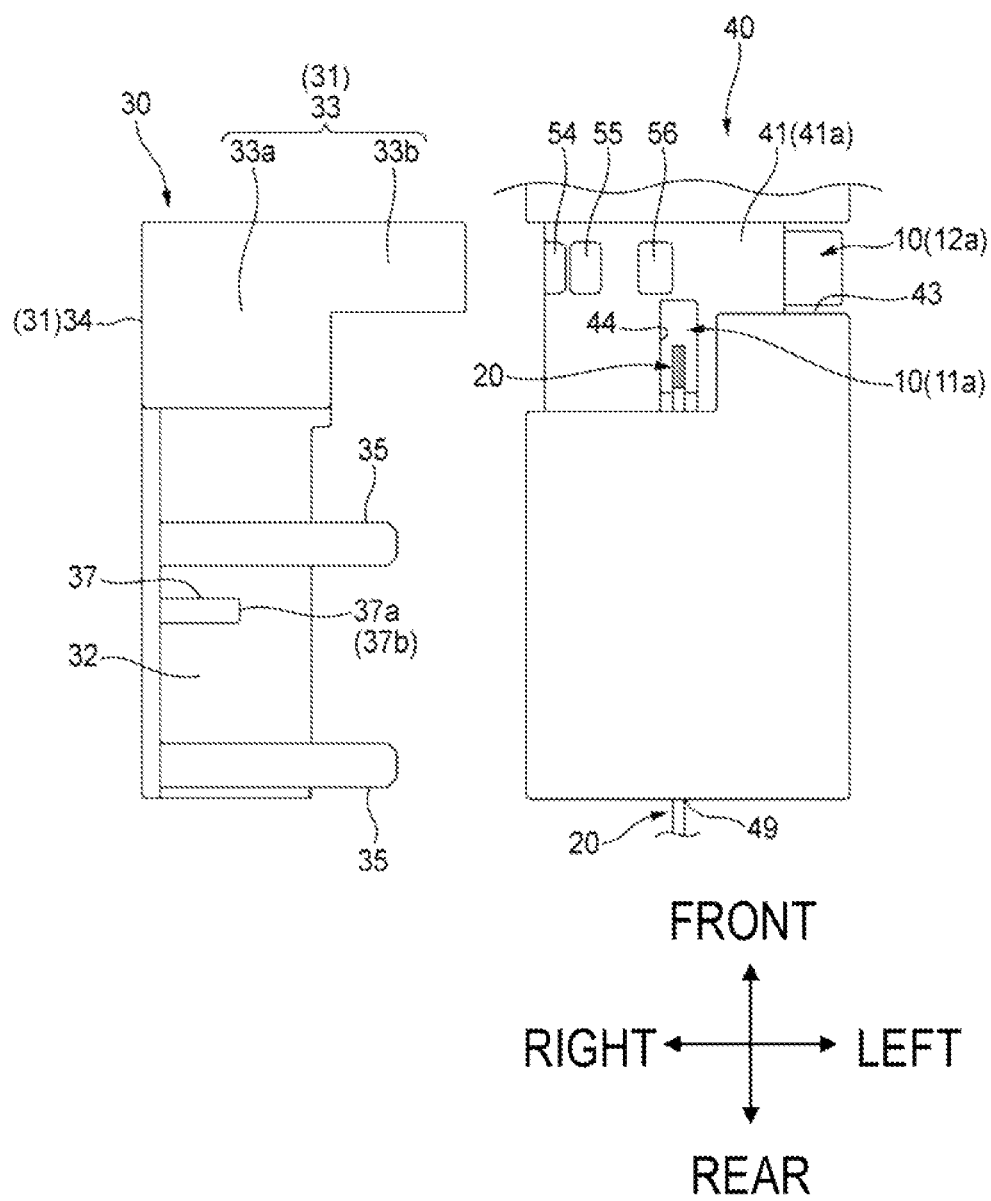
FIG. 6 is a bottom view showing the housing in which the voltage detection terminal and the electric wire are accommodated and the cover.

One end portion of the electric wire 20 is fixed to a lower surface of a distal end portion 11a (that is, an end portion on a rear end side) of the first portion 11 so as to be electrically connected thereto (see also FIG. 6). The other end portion of the electric wire 20 is connected to a voltage measuring device (not shown) outside the power storage device 1. A part of the flange portion 4a of the conductive plate 4 is fixed to a lower surface of a distal end portion 12a (that is, an end portion on a left end side) of the second portion 12 by a technique such as ultrasonic bonding or welding (see FIG. 2B).

A protruding portion 13 protruding forward is formed at a front-end edge of the second portion 12. When the voltage detection terminal 10 is accommodated in the housing 40, the protruding portion 13 is locked to a locking groove 45 (see FIG. 4) formed in the housing 40.

Next, the cover 30 will be described. The cover 30 is a resin molded product, and is attached to the cover attaching concaves 41 of the housing 40 from the right side. The cover 30 includes an opposing portion 31 and an extending portion 32 extending rearward from the opposing portion 31. The opposing portion 31 mainly functions to cover and protect the voltage detection terminal 10, and the extending portion 32 mainly functions to cover and protect the electric wire 20.

The opposing portion 31 includes a pair of flat plate portions 33 having the same shape and facing each other at an interval in the upper-lower direction, and a connecting portion 34 that connects, in the upper-lower direction, right end edges of the pair of flat plate portions 33 extending in the front-rear direction to each other over the entire area of the right end edges in the front-rear direction. The opposing portion 31 has a substantially U-shape opening leftward when viewed in the front-rear direction. The flat plate portions 33 each includes a substantially square flat plate-shaped base portion 33a connected to the connecting portion 34 and a rectangular flat plate shaped extending portion 33b extending leftward from a front-end portion of the base portion 33a, and has a substantially L shape as a whole when viewed in the upper-lower direction. The extending portion 32 extends rearward continuously from and is flush with a rear end edge of the upper flat plate portion 33 (more specifically, the upper base portion 33a) of the pair of flat plate portions 33 forming the opposing portion 31, and has a substantially rectangular flat plate shape.

In the extending portion 32, a pair of electric wire holding pieces 35 extending in the left-right direction are integrally formed so as to be arranged at an interval in the front-rear direction. As can be understood from FIG. 6, each electric wire holding piece 35 protrudes downward from a lower surface of the extending portion 32, extends in the left-right direction, and further protrudes leftward from a left end edge of the extending portion 32. When the cover 30 is attached to the housing 40, the electric wire holding pieces 35 function to hold the electric wire 20 accommodated in the housing 40.

A locking portion (not shown) protruding upward toward the upper flat plate portion 33 is formed at a predetermined position of the lower flat plate portion 33 (more specifically, the lower base portion 33a) of the pair of flat plate portions 33 forming the opposing portion 31. This locking portion functions to lock the cover 30 to a temporary locking position (see FIGS. 7A to 7C) and a final locking position (see FIGS. 8A to 8D) in cooperation with a temporary locked portion 55 and a final locked portion 56, which will be described later, provided in the housing 40.

A protruding portion 37 is formed integrally with the extending portion 32. As can be understood from FIG. 6, the protruding portion 37 protrudes downward from a lower surface of the extending portion 32 and extends in the left-right direction at a position between the pair of electric wire holding pieces 35 in the front-rear direction. A protruding height of the protruding portion 37 is larger than a protruding height of the pair of electric wire holding pieces 35. A distal end surface 37a of the protruding portion 37 on the left side is located on the lower surface of the extending portion 32 (that is, the distal end surface 37a of the protruding portion 37 is located further on the right side than a left end edge of the extending portion 32). A rib 37b protruding further leftward from a lower region of the distal end surface 37a of the protruding portion 37 is integrally formed with the distal end surface 37a (see FIGS. 7B and 8D). When the cover 30 is attached to the housing 40, the protruding portion 37 (particularly, the rib 37b) functions to prevent the electric wire 20 from coming out of a gap/space (see FIG. 8D) between a rib 48c and a groove bottom surface 48d, which will be described later, of the housing 40 (that is, prevent the electric wire 20 from coming out of the electric wire accommodating concave 46).

Next, the housing 40 will be described. The housing 40 is a resin molded product, and has a substantially rectangular thin plate shape extending in the front-rear direction, as shown in FIGS. 1, 3, and the like. The concave portion 5a that is concave rightward and extends in the front-rear direction is formed in a left end surface of the housing 40. The flange portion 4a of the conductive plate 4 is to be fitted into the concave portion 5a (see FIGS. 2A, 2B and the like).

The cover attaching concaves 41 each having a shape corresponding to the entire shape of the cover 30 and being concave are formed in portions, to which the cover 30 is to be attached, of upper and lower surfaces of the housing 40 (see FIG. 4). A concave depth (depth in the upper-lower direction) of the cover attaching concave 41 is equal to a plate thickness of the cover 30 (the opposing portion 31+ the extending portion 32). Therefore, when the cover 30 is attached to the housing 40, the surfaces of the housing 40 and surfaces of the cover 30 are flush with each other (see FIGS. 1, 8A and 8B).

The terminal accommodating concave 42 having a shape corresponding to the entire shape of the voltage detection terminal 10 and being further concave from a bottom surface 41a of the cover attaching concave 41 is formed in a portion, in which the voltage detection terminal 10 is to be accommodated, of the bottom surface 41a of the cover attaching concave 41 on an upper surface side of the housing 40 (see FIG. 4). A concave depth (depth in the upper-lower direction) of the terminal accommodating concave 42 is equal to a plate thickness of the voltage detection terminal 10. Therefore, when the voltage detection terminal 10 is attached to the housing 40, an upper surface of the voltage detection terminal 10 and the bottom surface 41a of the cover attaching concave 41 are flush with each other.

A notch 43 being concave rightward in a substantially rectangular shape when viewed in the upper-lower direction is formed at a position at a left end edge of the housing 40 in the front-rear direction where the distal end portion 12a of the voltage detection terminal 10 is to be disposed. The concave portion 5a extending in the front-rear direction on the left end surface of the housing 40 is divided via the notch 43. When the voltage detection terminal 10 is accommodated in the housing 40, upper and lower surfaces of the distal end portion 12a of the voltage detection terminal 10 are exposed via the notch 43 (see FIG. 7B).

A through hole 44 extending in the front-rear direction and penetrating in the upper-lower direction is formed in a portion of the terminal accommodating concave 42 where the distal end portion 11a of the voltage detection terminal 10 is to be disposed. When the voltage detection terminal 10 is accommodated in the housing 40, the one end portion (contact point) of the electric wire 20 connected to the voltage detection terminal 10 enters the through hole 44 (see FIG. 6). In other words, the through hole 44 functions as a relief portion for avoiding interference between a bottom surface 42a of the terminal accommodating concave 42 and the one end portion of the electric wire 20.

The locking groove 45 that is concave forward and communicates with the concave portion 5a to correspond to the protruding portion 13 is formed on an inner wall surface of the terminal accommodating concave 42 at a position where the protruding portion 13 (see FIG. 4) of the voltage detection terminal 10 is to be disposed (see FIG. 4).

The electric wire accommodating concave 46 being concave and having a shape corresponding to a routing form of the electric wire 20 when the electric wire 20 is accommodated is formed in a portion of an upper surface of the housing 40 where the electric wire 20 is to be accommodated (see FIG. 4). The electric wire accommodating concave 46 is a series of groove portions including a pair of straight portions 47 that extend in a straight line-shape extending in the front-rear direction and arranged at an interval in the front-rear direction, and a bent portion 48 connecting the pair of straight portions 47 and extending while being bent so as to protrude rightward. A front end of the front straight portion 47 of the pair of straight portions 47 communicates with the terminal accommodating concave 42, and a rear end of the rear straight portion 47 of the pair of straight portions 47 forms an electric wire draw-out opening 49 through which the electric wire 20 extends from a rear end edge of the housing 40. In this manner, since the electric wire accommodating concave 46 includes the bent portion 48, even when an unintended external force is applied to the electric wire 20 drawn out from the housing 40, the external force can be counteracted by friction between the bent portion 48 and the electric wire 20, as compared with a case where the electric wire accommodating concave 46 is formed only of the straight portions 47. Therefore, a large external force is unlikely to be applied to the contact point between the voltage detection terminal 10 and the electric wire 20.

Narrow-width concave portions 51, which are concave portion each having a width (interval in the left-right direction) narrower than that of the straight portion 47, are respectively provided at portions near boundaries between the pair of straight portions 47 and the bent portion 48. The width of the narrow-width concave portion 51 is slightly smaller than an outer diameter of the electric wire 20. Therefore, the narrow-width concave portions 51 function to hold the electric wire 20 while pressing the electric wire 20 in the left-right direction. Since the electric wire 20 is held by the pair of narrow-width concave portions 51, even when an unintended external force is applied to the electric wire 20 drawn out from the housing 40, the external force can be counteracted by friction between the narrow-width concave portions 51 and the electric wire 20. Therefore, a large external force is unlikely to be applied to the contact point between the voltage detection terminal 10 and the electric wire 20. Further, it is possible to in a more secure manner prevent the electric wire 20 from coming out of the bent portion 48 and being routed so as to skip the bent portion 48 (that is, to shortcut the bent portion 48).

As shown in FIG. 4, a pair of electric wire holding piece concave portions 52 that extend in the left-right direction and correspond to the pair of electric wire holding pieces 35 are formed in the bottom surface 41a of the cover attaching concave 41 on the upper surface side of the housing 40 at positions where the pair of electric wire holding pieces 35 of the cover 30 are to be disposed, so that the pair of electric wire holding piece concave portions 52 are arranged at an interval in the front-rear direction. The pair of electric wire holding piece concave portions 52 are arranged such that an apex 48a (see FIG. 4) of the bent portion 48 of the electric wire accommodating concave 46 is disposed between the pair of electric wire holding piece concave portions 52 in the front-rear direction. Bottom surfaces of the pair of electric wire holding piece concave portions 52 are located above a bottom surface of the electric wire accommodating concave 46.

Each electric wire holding piece concave portion 52 extends in the left-right direction from a right end edge of the housing 40 on the upper surface of the housing 40 to a left end inner wall 41b (see FIG. 4) of the cover attaching concave 41 across the electric wire accommodating concave 46. Accommodating holes 53 being concave leftward are respectively formed in portions, to which the pair of electric wire holding piece concave portions 52 are connected, of the left end inner wall 41b of the cover attaching concave 41 (see FIG. 4). When the cover 30 is attached to the housing 40, extended end portions (that is, left end portions) of the pair of electric wire holding pieces 35 of the cover 30 are inserted into and stored in the pair of accommodating holes 53.

As shown in FIG. 6, on the bottom surface 41a of the cover attaching concave 41 on a lower surface side of the housing 40, a contact portion 54, the temporary locked portion 55, and the final locked portion 56, which are concave portions being concave upward, are formed in this order so as to be arranged at intervals from right to left at a position in the front-rear direction same as the position where the locking portion described above of the cover 30 is disposed. As shown in FIG. 6, the contact portion 54 is a concave portion that is continuous from a right end edge of the housing 40.

As shown in FIG. 4, a communication concave portion 57 is formed in the bottom surface 41a of the cover attaching concave 41 on the upper surface side of the housing 40 at a position where the protruding portion 37 (see FIG. 6) of the cover 30 is to be disposed, so as to correspond to the protruding portion 37. The communication concave portion 57 extends in the left-right direction from the right end edge of the upper surface of the housing 40 to the apex 48a of the electric wire accommodating concave 46. In other words, the communication concave portion 57 allows the apex 48a of the electric wire accommodating concave 46 and the outside of the housing 40 to communicate with each other in the left-right direction. A bottom surface of the communication concave portion 57 and a bottom surface of the apex 48a (electric wire accommodating concave 46) are continuous so as to be flush with each other.

Figure 7A:
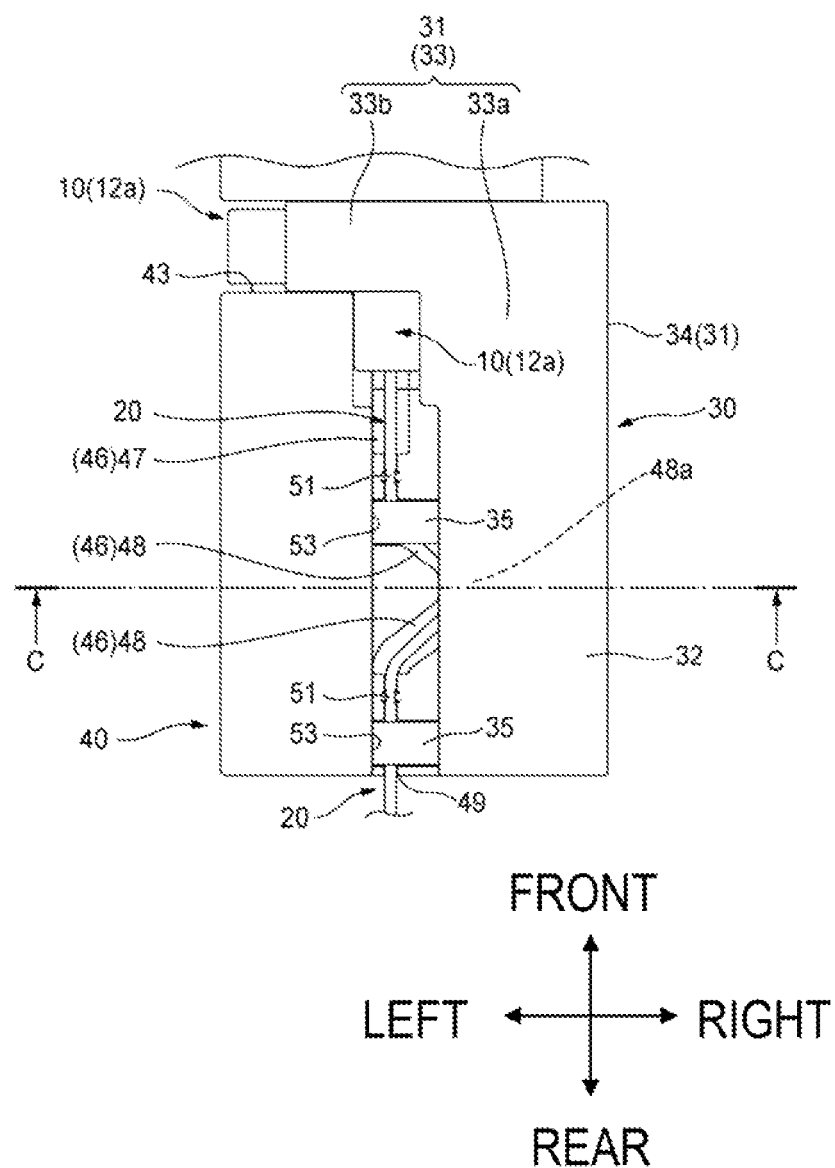
FIG. 7A is a top view showing a state in which the cover is locked to the housing at a temporary locking position.
Figure 7B:
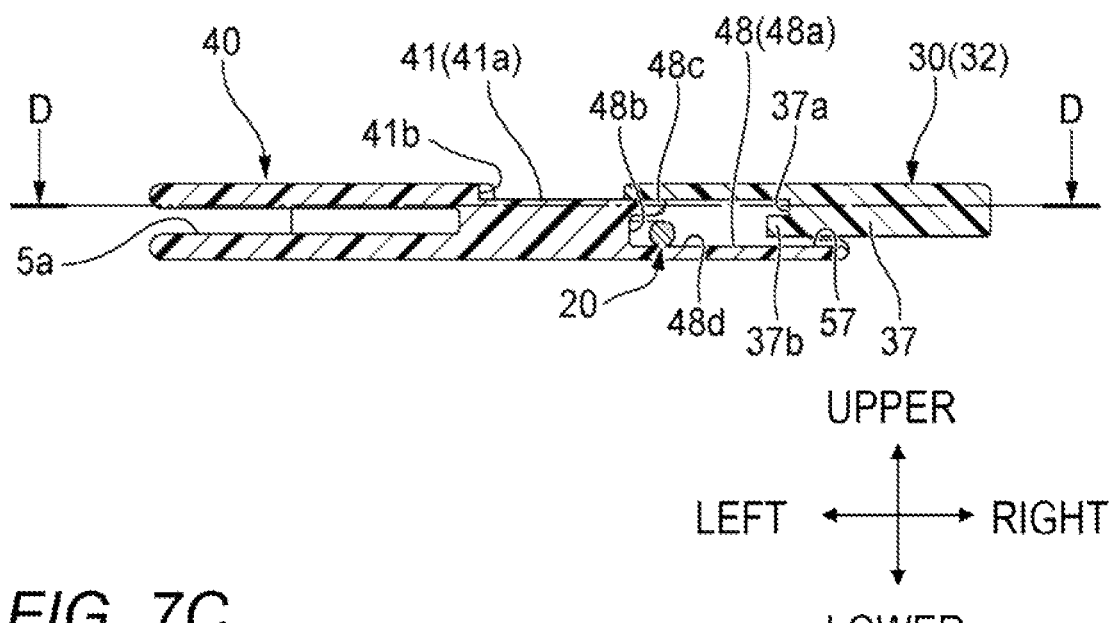
FIG. 7B is a cross-sectional view taken along a line C-C of FIG. 7A.
Figure 7C:
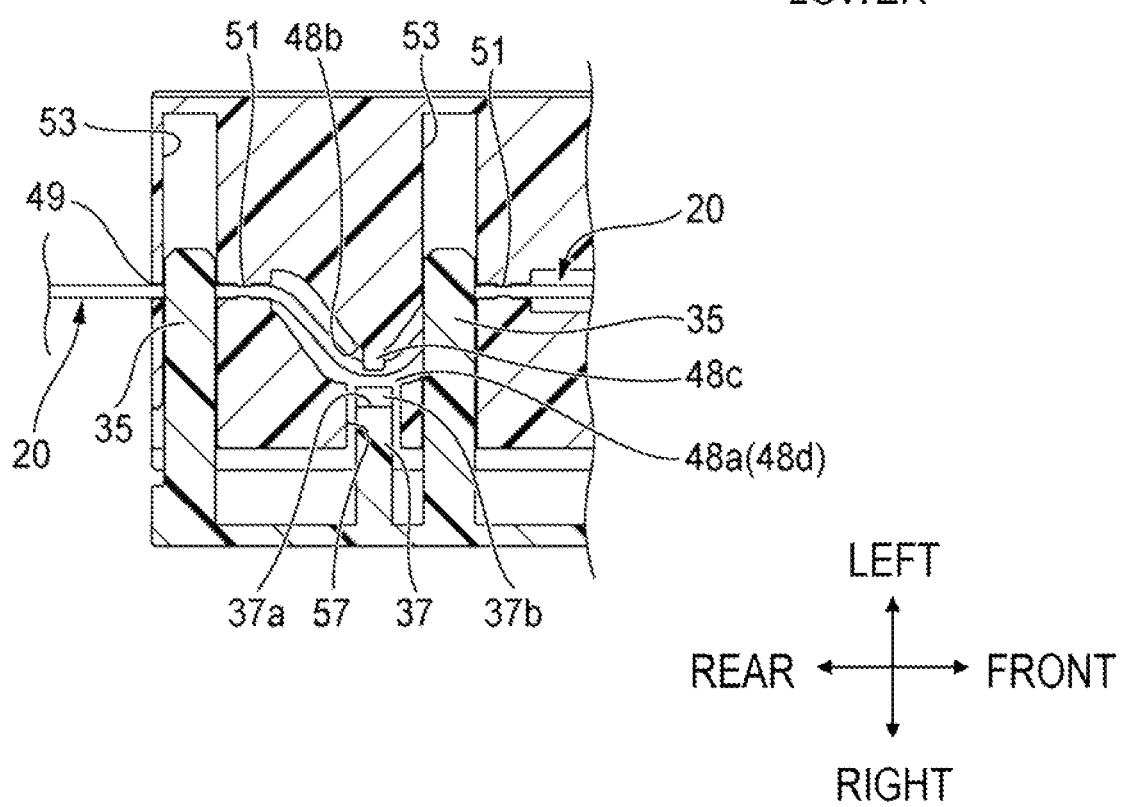
FIG. 7C is a cross-sectional view taken along a line D-D of FIG. 7B.

The rib 48c protruding further rightward from an upper region of a groove side wall (first groove side wall) 48b (that is, groove side wall having a convex shape protruding rightward) on a left side of the apex 48a is integrally formed on the groove side wall 48b (see FIGS. 7B and 7C). Specifically, the rib 48c is disposed so as to protrude rightward from the upper region of the groove side wall 48b toward a left end opening of the communication concave portion 57 that is formed in a groove side wall on a right side of the apex 48a (second groove side wall), and face the groove bottom surface 48d of the apex 48a with a gap therebetween in the upper-lower direction. A part of the electric wire 20 is accommodated in a gap between the rib 48c and the groove bottom surface 48d (see FIGS. 7B, 8D, and the like). The members forming the voltage detection unit 5 are described above.

Next, a procedure when the voltage detection terminal 10 and the cover 30 are attached to the housing 40 will be described. First, the voltage detection terminal 10 to which the electric wire 20 is connected in advance by a technique such as the ultrasonic bonding or the welding is accommodated in the terminal accommodating concave 42 of the housing 40. Therefore, the voltage detection terminal 10 is fitted into the terminal accommodating concave 42 of the housing 40 from above such that the protruding portion 13 enters the locking groove 45 and the one end portion (contact point) of the electric wire 20 enters the through hole 44. In a state where the accommodation of the voltage detection terminal 10 in the housing 40 is completed, the upper and lower surfaces of the distal end portion 12a of the voltage detection terminal 10 are exposed via the notch 43.

Next, the electric wire 20 extending from the voltage detection terminal 10 accommodated in the housing 40 is accommodated in the electric wire accommodating concave 46 of the housing 40. Therefore, the electric wire 20 is fitted from above along the electric wire accommodating concave 46 formed by the pair of straight portions 47 and the bent portion 48. At this time, a pair of portions of the electric wire 20 positioned above the pair of narrow-width concave portions 51 are pushed downward, whereby the pair of portions of the electric wire 20 are accommodated in the pair of narrow-width concave portions 51. The electric wire 20 located at the apex 48a is accommodated in a gap between the rib 48c and the groove bottom surface 48d of the apex 48a (see FIG. 7B). In a state where the accommodation of the electric wire 20 in the housing 40 is completed, the electric wire 20 extends rearward from the electric wire draw-out opening 49 to the outside of the housing 40.

Next, the cover 30 is attached to the housing 40. Therefore, the cover 30 is attached to the cover attaching concaves 41 of the housing 40 from the right side such that the opposing portion 31 of the cover 30 vertically sandwiches the cover attaching concaves 41 on the upper and lower surfaces of the housing 40, the extending portion 32 of the cover 30 covers the cover attaching concaves 41 on the upper surface side of the housing 40, the pair of electric wire holding pieces 35 of the cover 30 are accommodated in the pair of electric wire holding piece concave portions 52 of the housing 40, and the protruding portion 37 of the cover 30 is accommodated in the communication concave portion 57 of the housing 40.

In the process of attaching the cover 30 to the housing 40, the above-described locking portion of the cover 30 first comes into contact with a side surface of the contact portion 54 of the housing 40, goes over the contact portion 54 while sliding on the side surface, and then enters the inside of the temporary locked portion 55, so that the above-described locking portion engages with the temporary locked portion 55, and is pressed against a side surface of the temporary locked portion 55 on a left side. As a result, the cover 30 is locked to the housing 40 at the temporary locking position, the attachment of the cover 30 to the housing 40 is completed (see FIGS. 7A and 7B), and the voltage detection unit 5 (see FIG. 3) is obtained. As will be described later, the voltage detection unit 5 obtained after the attachment of the cover 30 to the housing 40 is completed (in the state where the cover 30 is locked at the temporary locking position) is used for assembling the conductive module 3 (see FIG. 1).

In the state where the cover 30 is locked at the temporary locking position, as shown in FIGS. 3, 7A and 7B, the opposing portion 31 (more specifically, the pair of upper and lower extending portions 33b) of the cover 30 does not cover the distal end portion 12a of the voltage detection terminal 10. Therefore, the upper and lower surfaces of the distal end portion 12a of the voltage detection terminal 10 are still exposed via the notch 43.

Further, the pair of electric wire holding pieces 35 of the cover 30 are disposed above a part of openings of the straight portion 47 and the bent portion 48 of the electric wire accommodating concave 46. As a result, the electric wire 20 is prevented from coming out of the electric wire accommodating concave 46. Further, the extended end portions of the pair of electric wire holding pieces 35 are inserted in the pair of accommodating holes 53. Accordingly, it is possible to prevent positional deviation of the pair of electric wire holding pieces 35 and unintended deformation such as separation of the pair of electric wire holding pieces 35 from the electric wire accommodating concave 46. Further, the extending portion 32 of the cover 30 is disposed above an opening of the apex 48a of the bent portion 48 of the electric wire accommodating concave 46. Accordingly, it is possible to in a more secure manner prevent the electric wire 20 from coming out of the electric wire accommodating concave 46 and being routed so as to skip the bent portion 48 (that is, to shortcut the bent portion 48). In this manner, it is possible to reduce a possibility that a specific problem occurs due to the electric wire 20 coming out of the bent portion 48 of the electric wire accommodating concave 46.

Further, when the cover 30 is locked at the temporary locking position, as shown in FIGS. 7B and 7C, the rib 37b of the protruding portion 37 of the cover 30 located in the communication concave portion 57 faces the groove side wall 48b of the apex 48a of the electric wire accommodating concave 46 in the left-right direction with the electric wire 20 interposed therebetween. At this stage, the rib 37b is located at a lower side than the rib 48c of the apex 48a, and does not overlap the rib 48c in the upper-lower direction (see FIG. 7B and the like). In other words, at this stage, the rib 37b of the protruding portion 37 is located inside the communication concave portion 57 (does not enter the inside of the apex 48a), and does not enter the gap between the rib 48c and the groove bottom surface 48d at the apex 48a (see FIGS. 7B and 7C).

Figure 8A:
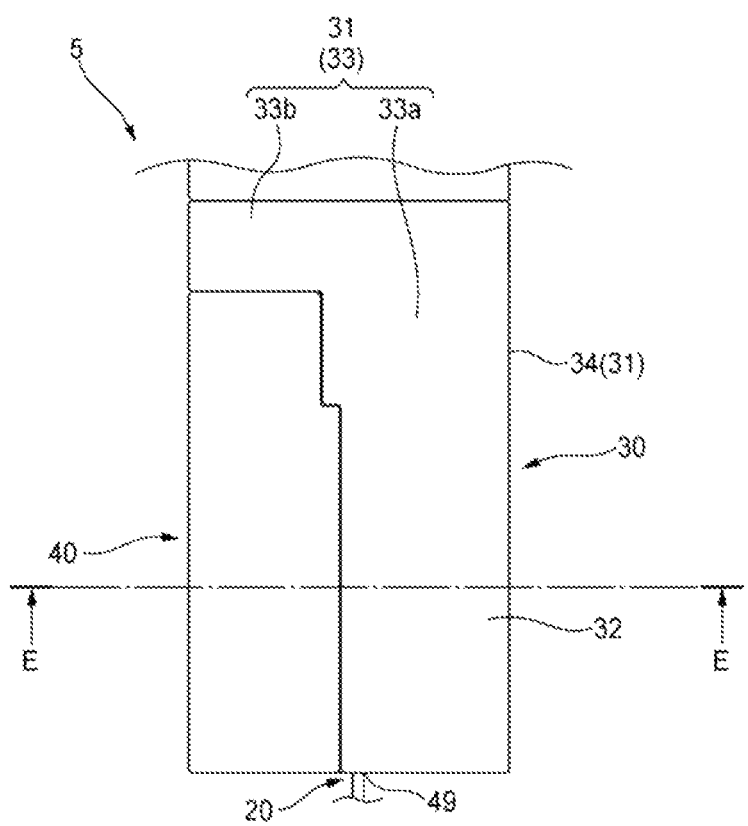
FIG. 8A is a top view showing a state in which the cover is locked to the housing at a final lock position.
Figure 8A:
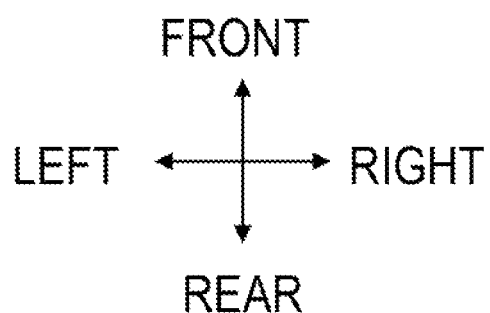

When the cover 30 is further pushed leftward with respect to the housing 40 in the state where the cover 30 is locked at the temporary locking position, the extended end portions of the pair of electric wire holding pieces 35 of the cover 30 further enter and are stored in the pair of accommodating holes 53, and the above-described locking portion of the cover 30 goes over the temporary locked portion 55, and then enters the inside of the final locked portion 56 to be engaged with the final locked portion 56 (see FIG. 8A). As a result, the cover 30 is locked to the housing 40 at the final locking position.

In the state where the cover 30 is locked at the final locking position, as shown in FIG. 8A, an entire region of the cover attaching concave 41 is covered by the cover 30, so that the entire electric wire accommodating concave 46 is covered by the extending portion 32 of the cover 30. As a result, the electric wire 20 is prevented from coming out of the electric wire accommodating concave 46. Further, as shown in FIG. 8A, the opposing portion 31 (more specifically, the pair of upper and lower extending portions 33b) of the cover 30 covers the upper and lower surfaces of the distal end portion 12a of the voltage detection terminal 10. As a result, the entire voltage detection terminal 10 is covered by the opposing portion 31 of the cover 30, and thus, the voltage detection terminal 10 can be reliably protected.

Figure 8B:
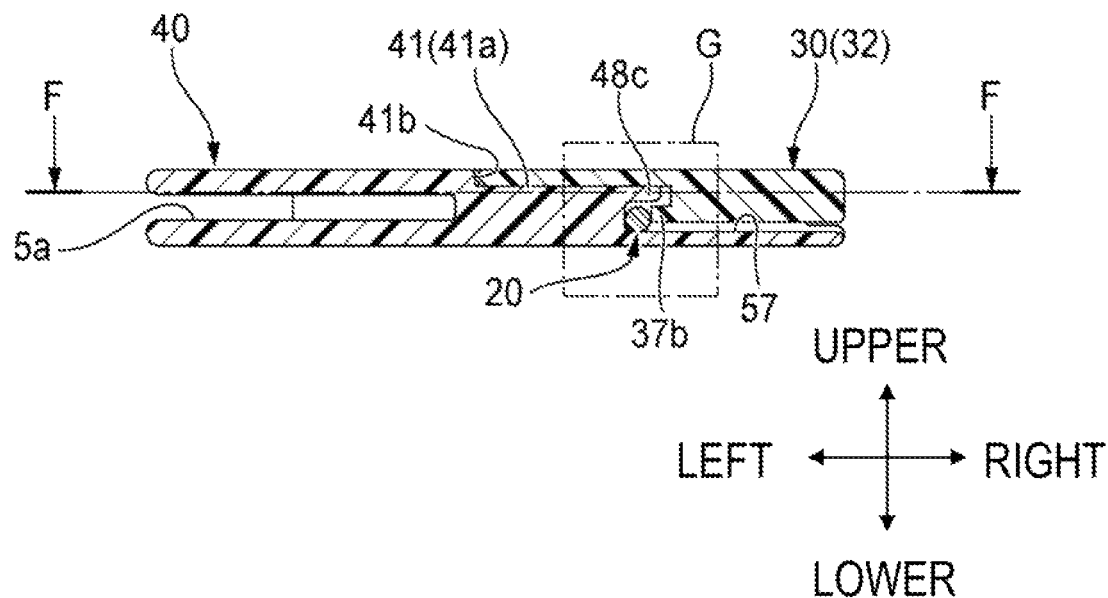
FIG. 8B is a cross-sectional view taken along a line E-E of FIG. 8A.
Figures 8C, 8D:
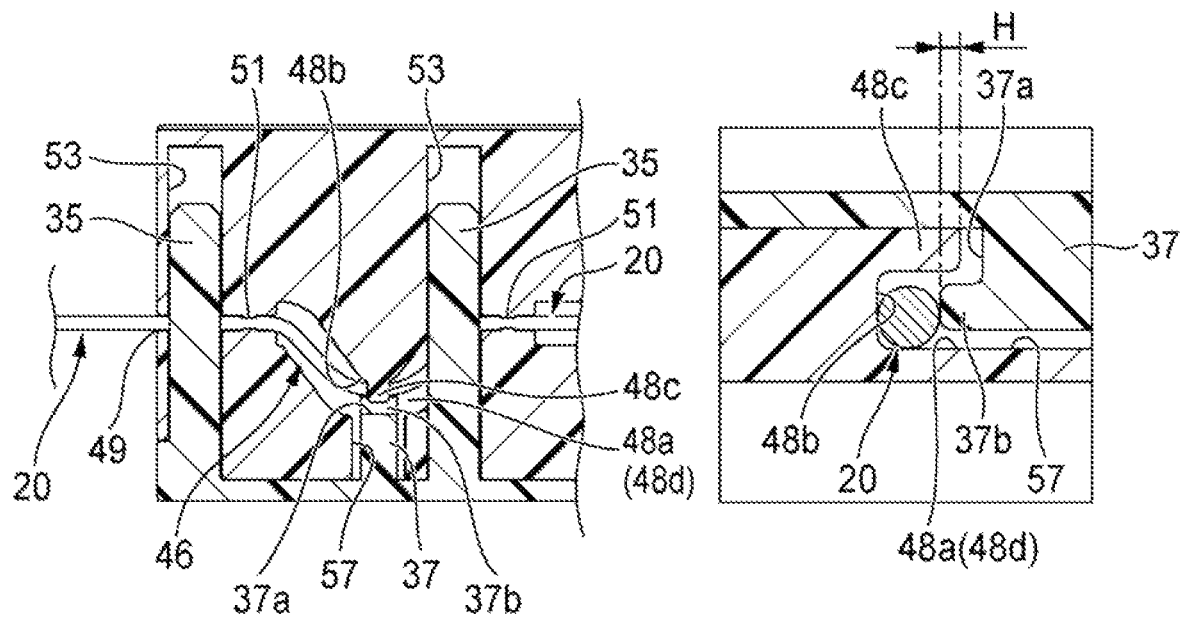
FIG. 8C is a cross-sectional view taken along a line F-F of FIG. 8B.
FIG. 8D is an enlarged view of a portion G in FIG. 8B.

Further, as shown in FIGS. 8B to 8D, the rib 37b of the protruding portion 37 of the cover 30 enters the gap between the rib 48*c* and the groove bottom surface 48*d* at the apex 48*a*, and the rib 37*b* and the rib 48*c* overlap each other by a dimension H (>0) in the left-right direction (see FIG. 8D). At this time, the electric wire 20 may be sandwiched while being pressed in the left-right direction by the rib 37*b* and the groove side wall 48*b*, or may be sandwiched with a gap in the left-right direction between the electric wire 20 and at least one of the rib 37*b* and the groove side wall 48*b*. Accordingly, it is possible to in a more secure manner prevent the electric wire 20 from coming out of the gap between the rib 48*c* and the groove bottom surface 48*d* and from being routed so as to skip the bent portion 48 (that is, to shortcut the bent portion 48).

Further, since the rib 37*b* and the rib 48*c* overlap with each other by the dimension H (>0), it is possible to prevent the extending portion 32 of the cover 30 from being displaced upward away from the cover attaching concave 41 such that the extending portion 32 moves away from the bottom surface 41*a* of the cover attaching concave 41 of the housing 40 (that is, the cover 30 is detached).

As described above, the voltage detection unit 5 obtained after the attachment of the cover 30 to the housing 40 is completed (in the state where the cover 30 is locked at the temporary locking position) is used for assembling the conductive module 3 (see FIG. 1). Specifically, first, as shown in FIG. 3, the flange portion 4*a* of the conductive plate 4 and the concave portion 5*a* of the voltage detection unit 5 are fitted to each other, so that the voltage detection unit 5 is connected to the right side of the conductive plate 4.

In this state, as can be understood from FIG. 3, a part of the flange portion 4*a* of the conductive plate 4 is disposed so as to overlap a lower side of the distal end portion 12*a* of the voltage detection terminal 10 (see also FIG. 2B), and since the notch 43 of the housing 40 is present, the upper surface of the distal end portion 12*a* of the voltage detection terminal 10 is exposed upward, and a part of a lower surface of the flange portion 4*a* of the conductive plate 4 is exposed downward.

Next, by using the upper surface of the distal end portion 12*a* of the voltage detection terminal 10 exposed upward and the part of the lower surface of the flange portion 4*a* of the conductive plate 4 exposed downward, the distal end portion 12*a* of the voltage detection terminal 10 and the part of the flange portion 4*a* of the conductive plate 4 are fixed to each other by a technique such as the ultrasonic bonding or the welding. Thereafter, the cover 30 is moved from the temporary locking position to the final locking position, and the assembly of the voltage detection unit 5 and the conductive plate 4 is completed.

Figure 2B:
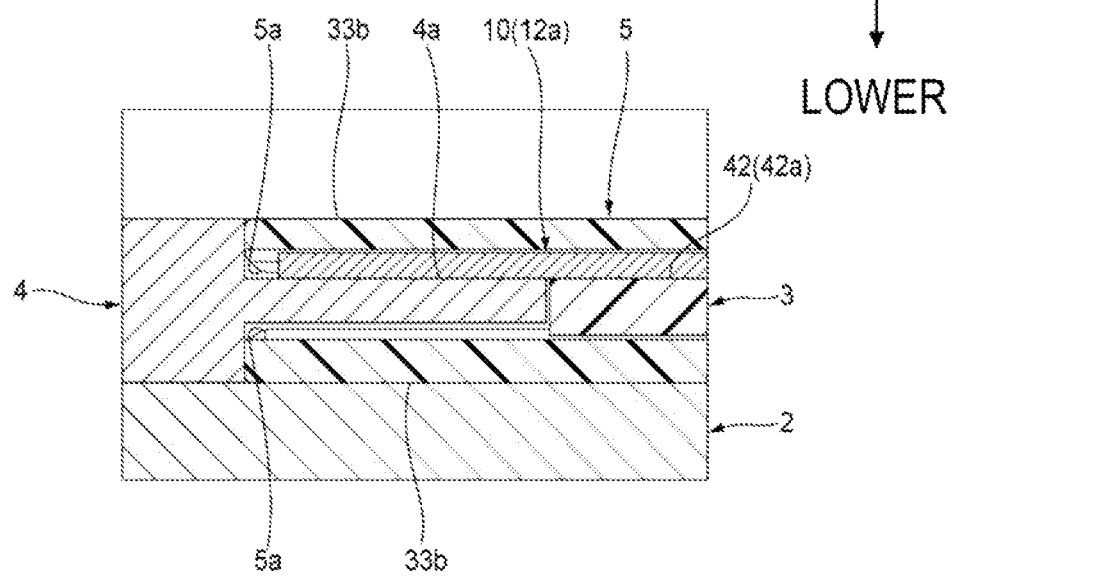
FIG. 2B is an enlarged view of a portion B of FIG. 2A.
Figure 3:
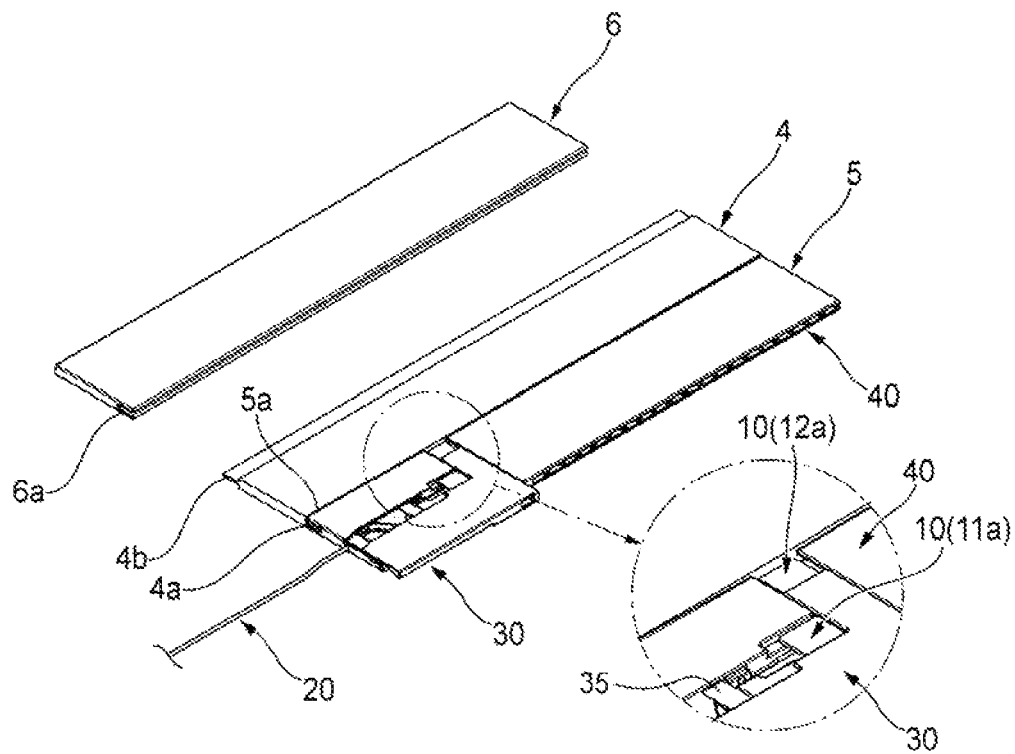
FIG. 3 is a partially exploded perspective view of a conductive module shown in FIG. 1.

Next, the flange portion 4*b* of the conductive plate 4 and the concave portion 6*a* of the opposite unit 6 are fitted to each other, so that the opposite unit 6 is connected to the left side of the conductive plate 4 to which the voltage detection unit 5 is has been attached (see FIGS. 2A and 2B and the like). Thus, the assembly of the conductive module 3 is completed.

The conductive module 3 obtained in this manner is subjected to assembly of the power storage device 1 shown in FIG. 1. Specifically, the power storage device 1 is obtained by alternately stacking the power storage modules 2 and the conductive modules 3 in the upper-lower direction and fixing these stacked modules with a predetermined metal fitting or the like.

As described above, according to the voltage detection unit 5 of the present embodiment, the voltage detection terminal 10 to which the electric wire 20 is connected can be accommodated in the terminal accommodating concave 42 of the plate shaped housing 40, and the electric wire 20 extending from the voltage detection terminal 10 can be drawn out to the outside of the housing 40 through the electric wire accommodating concave 46. As a result, the voltage detection terminal 10 and the electric wire 20 can be stored inside the voltage detection unit 5 while reducing a thickness of the voltage detection unit 5 (that is, forming the voltage detection unit 5 into a plate shaped outer shape). Further, when the voltage detection unit 5 is electrically connected to the conductive plate 4 to be used in the power storage device 1, for example, after the voltage detection unit 5 is attached to the conductive plate 4, the exposed voltage detection terminal 10 and the conductive plate 4 can be fixed by using a technique such as the ultrasonic bonding or the welding. As a result, as compared with typical bolt fastening or the like, it is possible to eliminate a need for other components for connection, and as compared with the above-described connection method in the related art, it is possible to facilitate position alignment of the voltage detection terminal 10 and the conductive plate 4 and to reduce contact resistance at a contact point. Therefore, the voltage detection unit 5 according to the present embodiment is excellent in workability of the conductive connection with the conductive plate 4.

Further, according to the voltage detection unit 5, the electric wire 20 is held between the rib 48*c* of the housing 40 and the groove bottom surface 48*d* of the electric wire accommodating concave 46. As a result, it is possible to reduce a thickness of the housing 40 (that is, formed into a plate shape) while the electric wire 20 is being prevented from coming out of the electric wire accommodating concave 46. Therefore, for example, even when an unintended external force is applied to the electric wire 20 drawn out from the housing 40, a state in which the electric wire 20 (accordingly, the voltage detection terminal 10 connected to the electric wire 20) is appropriately disposed in the housing 40 is maintained. In this manner, the voltage detection unit 5 can implement both reducing a thickness of an outer shape and appropriately holding the voltage detection terminal 10 and the electric wire 20 accommodated therein.

Further, since the voltage detection terminal 10 and the electric wire 20 are covered by the cover 30 and the electric wire 20 is prevented from coming out of the gap between the rib 48*c* and the groove bottom surface 48*d* by the protruding portion 37 (rib 37*b*) of the cover 30, the state in which the voltage detection terminal 10 and the electric wire 20 are appropriately disposed in the housing 40 is more firmly maintained. In addition, since the rib 48*c* restricts the electric wire 20 from coming out of the electric wire accommodating concave 46, it is possible to prevent the electric wire 20 that has been displaced from interfering with the attachment of the cover 30.

Further, the electric wire accommodating concave 46 of the housing 40 includes the straight portions 47 and the bent portion 48. Therefore, when an unintended external force is applied to the electric wire 20 drawn out from the housing 40, the external force is counteracted by the friction between the bent portion 48 and the electric wire 20, as compared with the case where the electric wire accommodating concave 46 is formed only of the straight portions 47, so that the external force is unlikely to be directly applied to the contact point between the voltage detection terminal 10 and the electric wire 20. Further, the rib 48*c* is disposed at a position corresponding to the apex 48*a* of the bent portion 48, so that it is possible to in a more secure manner prevent the electric wire 20 from coming out of the electric wire accommodating concave 46 and being routed so as to skip the bent portion 48 (that is, to shortcut the bent portion 48). Accordingly, an effect of receiving the external force by the bent portion 48 applied to the electric wire 20 is more reliably exhibited. Therefore, the voltage detection unit 5 can improve the reliability of the electric connection between the voltage detection terminal 10 and the electric wire 20.

The presently disclosed subject matter is not limited to the above embodiments and may adopt various modifications within the scope thereof. For example, the presently disclosed subject matter is not limited to the above-described embodiment, and can be modified, improved, and the like as appropriate. In addition, materials, shapes, dimensions, numbers, arrangement positions or the like of each constituent element in the embodiments described above are optional and not limited as long as the object of the presently disclosed subject matter can be achieved.

In the above embodiment, the cover 30 is provided with the pair of electric wire holding pieces 35. However, the cover 30 may be provided with one electric wire holding piece 35, three or more electric wire holding pieces 35, or no electric wire holding piece 35.

Further, in the above embodiment, the two narrow-width concave portions 51 are provided in the electric wire accommodating concave 46 of the housing 40. However, the electric wire accommodating concave 46 of the housing 40 may be provided with one narrow-width concave portion 51, three or more narrow-width concave portions 51, or no narrow-width concave portion 51.

Figure 9:
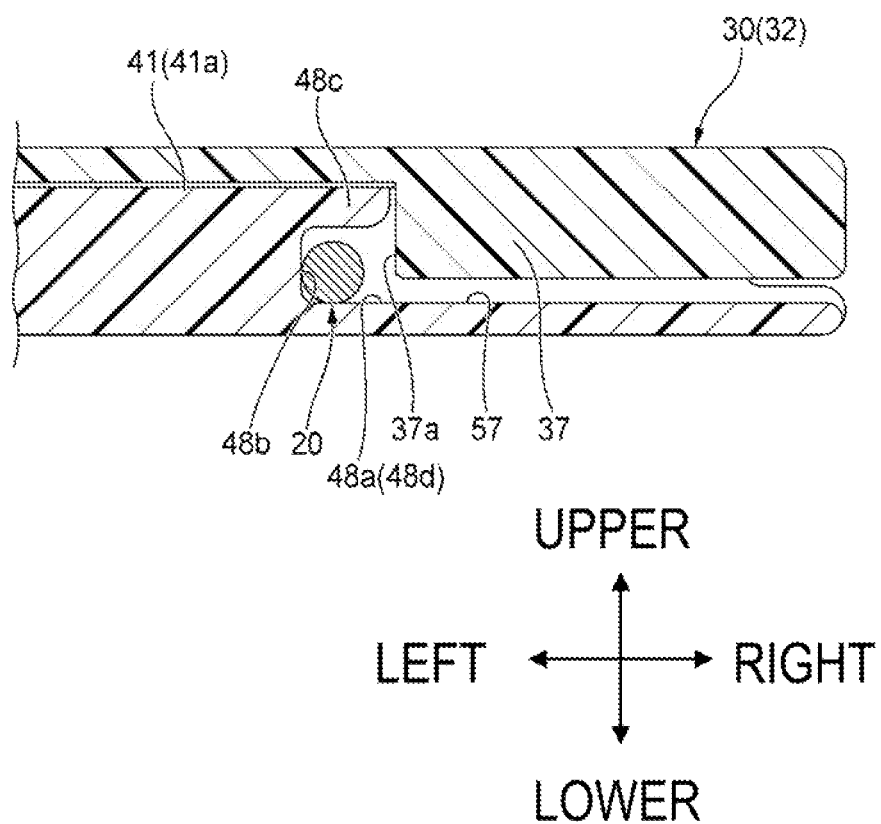
FIG. 9 is a cross-sectional view corresponding to FIG. 8B of a voltage detection unit according to a modification.

Further, in the above embodiment, in the state in which the rib 37b on the distal end surface 37a of the protruding portion 37 of the cover 30 is provided and the cover 30 is locked at the final locking position, the rib 37b enters the gap between the rib 48c and the groove bottom surface 48d at the apex 48a, so that the electric wire 20 is prevented from coming out of the gap between the rib 48c and the groove bottom surface 48d (see FIG. 8D). Here, in the above-described embodiment, the rib 48c at the apex 48a and the rib 37b of the cover 30 overlap with each other by the dimension H in the left-right direction. Besides, the rib 48c and the rib 37b may not have to overlap with each other as long as the electric wire 20 can be prevented from coming out. For example, a distal end of the rib 48c and a distal end of the rib 37b may be away from each other at an interval smaller than a diameter of the electric wire 20 in the left-right direction. Further, as shown in FIG. 9, the rib 37b on the distal end surface 37a of the protruding portion 37 of the cover 30 may not be provided. In the example shown in FIG. 9, in the state where the cover 30 is locked at the final locking position, the distal end surface 37a of the protruding portion 37 is located so as to close an opening of the gap between the rib 48c and the groove bottom surface 48d at the apex 48a. Accordingly, the electric wire 20 is prevented from coming out of the gap between the rib 48c and the groove bottom surface 48d.

Figure 10:
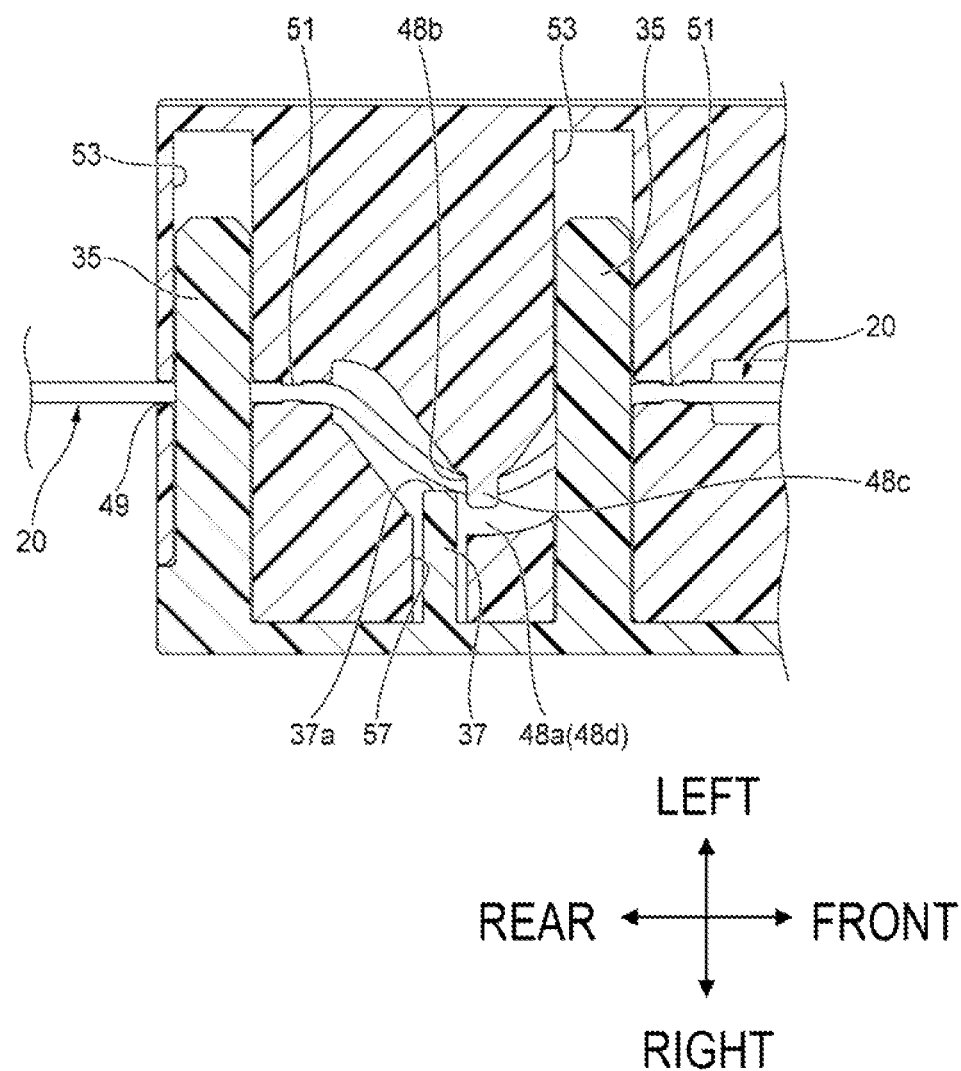
FIG. 10 is a cross-sectional view corresponding to FIG. 8C of a voltage detection unit according to another modification.

Further, in the above embodiment, the communication concave portion 57 is provided at a position in the front-rear direction that corresponds to the apex 48a of the bent portion 48, and the protruding portion 37 (rib 37b) of the cover 30 inserted through the communication concave portion 57 enters the gap between the rib 48c and the groove bottom surface 48d at the apex 48a (see FIG. 8C). Besides, as shown in FIG. 10, the communication concave portion 57 may be provided at a position in the front-rear direction that corresponds to a portion of the bent portion 48 other than the apex 48a in the electric wire accommodating concave 46. In the example shown in FIG. 10, in the state where the cover 30 is locked at the final locking position, the distal end surface 37a of the protruding portion 37 of the cover 30 inserted through the communication concave portion 57 is disposed so as not to overlap the rib 48c in the front-rear direction but to overlap the rib 48c in the left-right direction. At this time, the electric wire 20 may be sandwiched while being pressed in the left-right direction by the distal end surface 37a of the protruding portion 37 and a groove side wall of the bent portion 48 at the corresponding position, or may be sandwiched with a gap in the left-right direction between the electric wire 20 and at least one of the distal end surface 37a of the protruding portion 37 and the groove side wall of the bent portion 48 at the corresponding position. In this manner also, the electric wire 20 is prevented from coming out of the gap between the rib 48c and the groove bottom surface 48d.

According to an aspect of the embodiments described above, a voltage detection unit (5) includes a voltage detection terminal (10) configured to be conductively connected to a detection target (4), an electric wire (20) conductively connected to the voltage detection terminal (10) and a housing (40) having a plate shape and including a terminal accommodating concave (42) configured to accommodate the voltage detection terminal (10), an electric wire accommodating concave (46) defined by a first groove side wall (48b), a second groove side wall and a groove bottom surface (48d), and configured to accommodate the electric wire (20) and to guide the electric wire (20) out of the housing (40), and an electric wire restricting portion (48c) configured to hold the electric wire (20) between the electric wire restricting portion (48c) and the groove bottom surface (48d) and to prevent the electric wire (20) from being displaced out of the electric wire accommodating concave (46).

According to the voltage detection unit having the above described configuration, the voltage detection terminal to which the electric wire is connected can be accommodated in the terminal accommodating concave of the plate shaped housing, and the electric wire extending from the voltage detection terminal can be drawn out to the outside of the housing through the electric wire accommodating concave. As a result, the voltage detection terminal and the electric wire can be stored inside the voltage detection unit while reducing the thickness of the voltage detection unit (that is, forming the voltage detection unit into a plate shaped outer shape). Further, when the voltage detection unit is electrically connected to the detection target (for example, conductive plate used in the stacked power storage device), for example, after the voltage detection unit is attached to the detection target, the exposed voltage detection terminal and the detection target can be fixed by using a technique such as the ultrasonic bonding or the welding. As a result, as compared with typical bolt fastening or the like, it is possible to eliminate a need for other components for connection, and as compared with the above-described connection method in the related art, it is possible to facilitate position alignment of the voltage detection terminal and the conductive plate and to reduce contact resistance at a contact point. Therefore, the voltage detection unit having the present configuration is excellent in the workability of the conductive connection with the detection target.

Further, according to the voltage detection unit having the above-described configuration, the electric wire is held between the electric wire restricting portion (for example, a rib or the like extending from the groove side wall of the electric wire accommodating concave) of the housing and the groove bottom surface of the electric wire accommodating concave. As a result, even when a thickness of the housing is reduced (that is, formed into a plate shape), the electric wire is prevented from coming out of the electric wire accommodating concave. Therefore, for example, even when an unintended external force is applied to the electric wire drawn out from the housing, a state in which the electric wire (accordingly, the voltage detection terminal connected to the electric wire) is appropriately disposed in the housing is maintained. In this manner, the voltage detection unit having the present configuration can implement both reducing a thickness of an outer shape and appropriately holding the voltage detection terminal and the electric wire accommodated therein.

The voltage detection unit (5) may further include a cover (30) configured to be attached to the housing (40) and to cover the voltage detection terminal (10) accommodated in the terminal accommodating concave (42) and the electric wire (20) accommodated in the electric wire accommodating concave (46), and including a protruding portion (37) protruding in a first direction in which the cover (30) is attached to the housing (40). The electric wire restricting portion (48c) may protrude from the first groove side wall (48b) toward the second groove side wall. The second groove side wall may include a communication portion (57) communicating an inner space of the electric wire accommodating concave (46) defined by the first groove side wall (48b), the second groove side wall and the groove bottom surface (48d) and an outside of the housing (40) to each other. The cover (30) may be configured such that, as the cover (30) is being attached to the housing (40), the protruding portion (37) is inserted into the electric wire accommodating concave (46) through the communication portion (57) and approaches the electric wire restricting portion (48c), thereby preventing the electric wire (20) from being displaced out of a space between the electric wire restricting portion (48c) and the groove bottom surface (48d).

With this configuration, the voltage detection terminal and the electric wire are covered by the cover. Further, by the protruding portion of the cover, the electric wire is prevented from coming out of the space/gap between the electric wire restricting portion and the groove bottom surface. Therefore, the state in which the voltage detection terminal and the electric wire are appropriately disposed in the housing is more firmly maintained. In addition, since the electric wire restricting portion prevents the electric wire from coming out of the electric wire accommodating concave, it is possible to prevent the electric wire that has been displaced out of the space from interfering with the attachment of the cover.

The electric wire accommodating concave (46) may include a bent portion (48) configured to guide the electric wire (20) such that the electric wire (20) is bent in a convex shape with respect to a second direction defined by a straight line connecting the voltage detection terminal (10) and an electric wire draw-out opening (49) of the housing (40). The electric wire restricting portion (48c) may be disposed such that the electric wire restricting portion (48c) holds the electric wire (20) between the electric wire restricting portion (48c) and the groove bottom surface (48d) at an apex (48a) of the bent portion (48).

With this configuration, the electric wire accommodating concave of the housing includes the bent portion. Therefore, when an unintended external force is applied to the electric wire drawn out from the housing, the external force is counteracted by the friction between the bent portion and the electric wire, as compared with the case where the electric wire accommodating concave only has the concave portion extending in the second direction, so that the external force is unlikely to be directly applied to the contact point between the voltage detection terminal and the electric wire. Further, the electric wire restricting portion (for example, a rib) is disposed at a position corresponding to the apex of the bent portion, so that it is possible to in a more secure manner prevent the electric wire from coming out of the electric wire accommodating concave and from being routed so as to skip the bent portion (that is, to shortcut the bent portion). Accordingly, an effect of receiving the external force by the bent portion applied to the electric wire is more reliably exhibited. Therefore, the voltage detection unit having the present configuration can improve the reliability of the electric connection between the voltage detection terminal and the electric wire.

What is claimed is:

1. A voltage detection unit comprising:
a voltage detection terminal configured to be conductively connected to a detection target;
an electric wire conductively connected to the voltage detection terminal; and
a housing having a plate shape and including: a terminal accommodating concave configured to accommodate the voltage detection terminal; an electric wire accommodating concave defined by a first groove side wall, a second groove side wall and a groove bottom surface, and configured to accommodate the electric wire and to guide the electric wire out of the housing; and an electric wire restricting portion configured to hold the electric wire between the electric wire restricting portion and the groove bottom surface and to prevent the electric wire from being displaced out of the electric wire accommodating concave.

2. The voltage detection unit according to claim 1, further comprising:
a cover configured to be attached to the housing and to cover the voltage detection terminal accommodated in the terminal accommodating concave and the electric wire accommodated in the electric wire accommodating concave, and including a protruding portion protruding in a first direction in which the cover is attached to the housing,
wherein the electric wire restricting portion protrudes from the first groove side wall toward the second groove side wall,
wherein the second groove side wall includes a communication portion communicating an inner space of the electric wire accommodating concave defined by the first groove side wall, the second groove side wall and the groove bottom surface and an outside of the housing to each other, and
wherein the cover is configured such that, as the cover is being attached to the housing, the protruding portion is inserted into the electric wire accommodating concave through the communication portion and approaches the electric wire restricting portion, thereby preventing the electric wire from being displaced out of a space between the electric wire restricting portion and the groove bottom surface.

3. The voltage detection unit according to claim 1,
wherein the electric wire accommodating concave includes a bent portion configured to guide the electric wire such that the electric wire is bent in a convex shape with respect to a second direction defined by a straight line connecting the voltage detection terminal and an electric wire draw-out opening of the housing, and wherein the electric wire restricting portion is disposed such that the electric wire restricting portion holds the electric wire between the electric wire restricting portion and the groove bottom surface at an apex of the bent portion.

* * * * *